United States Patent
Komi et al.

(10) Patent No.: US 8,031,477 B2
(45) Date of Patent: Oct. 4, 2011

(54) SYSTEM AND METHOD FOR COUPLING A LENS TO A PRINTED CIRCUIT

(75) Inventors: Satoshi Komi, Saitama Pref. (JP); Tohru Takahashi, Kawaguchi (JP)

(73) Assignees: Optoelectronics Co., Ltd., Warabi, Saitama Pref.; Opticon, Inc., Orangeburg, NY (US)

( * ) Notice: Subject to any disclaimer, the term of this patent is extended or adjusted under 35 U.S.C. 154(b) by 50 days.

(21) Appl. No.: 12/845,792

(22) Filed: Jul. 29, 2010

(65) Prior Publication Data

US 2010/0302747 A1    Dec. 2, 2010

Related U.S. Application Data

(63) Continuation of application No. PCT/US2008/054091, filed on Feb. 15, 2008.

(51) Int. Cl.
    *H05K 7/10*      (2006.01)
(52) U.S. Cl. ......... 361/767; 361/760; 361/749; 174/262
(58) Field of Classification Search ........... 361/760, 361/767, 772, 777, 807, 808, 762, 748, 749, 361/750, 751; 174/261, 262, 265, 267, 268; 349/149, 150, 152
See application file for complete search history.

(56) References Cited

U.S. PATENT DOCUMENTS

| | | | |
|---|---|---|---|
| 6,493,511 B2 | 12/2002 | Sato | |
| 6,848,176 B2 * | 2/2005 | Hishinuma et al. | 29/846 |
| 7,312,400 B2 * | 12/2007 | Ito et al. | 174/250 |
| 7,570,297 B2 * | 8/2009 | Maeda et al. | 348/340 |
| 7,633,047 B2 * | 12/2009 | Kim | 250/221 |
| 2005/0136646 A1 * | 6/2005 | Larnerd et al. | 438/629 |
| 2007/0195187 A1 * | 8/2007 | Tagata et al. | 348/340 |
| 2007/0284140 A1 * | 12/2007 | Danoski et al. | 174/262 |

OTHER PUBLICATIONS

International Search Report and Written Opinion, dated Jul. 14, 2008, of International Application No. PCT/US08/53811, filed: Feb. 13, 2008.
International Preliminary Report on Patentability, dated Aug. 17, 2010, of International Application No. PCT/US08/54091, filed: Feb. 13, 2008.
International Search Report and Written Opinion, dated Jul. 14, 2008, of International Application No. PCT/US08/54091, filed: Feb. 15, 2008.

* cited by examiner

*Primary Examiner* — Hoa C Nguyen
(74) *Attorney, Agent, or Firm* — Sorin Royer Cooper LLC

(57) ABSTRACT

An optical assembly is disclosed which may include a lens having first and second electrodes; and a flexible printed circuit (FPC) configured for placement in proximity to the lens, wherein the FPC may include a bottom insulating layer; a top insulating layer; and an FPC electrode configured to contact the second electrode of the lens, wherein the FPC electrode may include a center portion disposed between the bottom and top insulating layers of the FPC; a post connected to the center portion and extending through the top insulating layer of the FPC; and a contact layer connected to the post and configured to provide the contact with the second electrode of the lens.

17 Claims, 7 Drawing Sheets

SYSTEM AND METHOD FOR COUPLING A LENS TO A PRINTED CIRCUIT

This application is a continuation of International Application No. PCT/US08/54091, filed Feb. 15, 2008, which designated the United States of America and was published in English on Aug. 20, 2009 under Publication No. WO 2009/102336. This International Application is hereby incorporated by reference in its entirety.

BACKGROUND ART

This invention relates in general to connections made for circuitry for digital imaging equipment, and in particular to establishing electrical contact between a lens and one or more electrodes on a circuit board.

Modern digital cameras may include a lens barrel including various parts that enable operation of the camera. Among the parts included in such lens barrels are lenses, which may be liquid lenses, and Flexible Printed Circuits (FPCs). A proper connection between the FPC and the liquid lens is needed to enable image data to be properly acquired. When the FPC and the lens are optimally located in relation to one another, electrical connectivity is generally successfully achieved.

However, in practice, the connection between the FPC and the liquid lens is susceptible to various problems. A positioning error of either the FPC or the liquid lens and/or any misalignment of the parts may cause a short circuit between one electrode on the liquid lens and another on the FPC. Alternatively, positioning or alignment error may disrupt conductive electrical contact between corresponding electrodes, thereby inhibiting proper operation of the camera.

Accordingly, there is a need in the art for an improved system and method for connecting an FPC to a lens within an optical assembly, such as a digital camera assembly.

SUMMARY OF THE INVENTION

According to one aspect, the invention provides a printed circuit that may include a first insulating layer; a second insulating layer; and an electrode including a electrode center portion disposed between the first and second insulating layers; a electrode post portion in contact with the electrode center portion and extending through at least a portion of the first insulating layer; and an electrode contact layer connected to the electrode post, and arranged in proximity to the first insulating layer. Preferably, the first insulating layer, second insulating layer, and electrode center portion have substantially the same length. Preferably, the electrode center portion is insulated along an entirety of its length, along its lower surface, by the second insulating layer.

Preferably, the electrode center portion is insulated over an upper surface thereof, along substantially an entirety of its length. Preferably, the electrode contact layer is disposed above the first insulating layer. Preferably, the electrode contact layer is disposed along an exterior of the printed circuit. Preferably, the electrode contact layer has a length configured to accommodate movement of the printed circuit with respect to an external part in conductive contact with the electrode contact layer, while maintaining the conductive contact. Preferably, the length of the electrode contact layer is substantially less than the length of the electrode center portion. Preferably, the printed circuit has annular shape that is configured to engage an annularly shaped lens interface within an optical assembly. Preferably, the radial dimensions of the annular printed circuit and of the annular shaped lens are configured to enable conductive electrical contact to be maintained even if the axes of the printed circuit and of the lens are offset with respect to one another.

According to another aspect, the invention provides an optical assembly, that may include a lens having first and second electrodes; and a flexible printed circuit (FPC) configured for placement in proximity to the lens, wherein the FPC may include a bottom insulating layer; a top insulating layer; and an FPC electrode configured to contact the second electrode of the lens, wherein the FPC electrode may include a center portion disposed between the bottom and top insulating layers of the FPC; a post connected to the center portion and extending through the top insulating layer of the FPC; and a contact layer connected to the post and configured to provide the contact with the second electrode of the lens.

Preferably, the FPC electrode contact layer is disposed between the top insulating layer and the lens. Preferably, the FPC electrode contact layer is configured to maintain conductive electrical contact with the second lens electrode upon the occurrence of relative lateral movement between the lens and the FPC. Preferably, the second lens electrode and the FPC electrode contact layer are annular. Preferably, the contact between the second lens electrode and the FPC electrode contact layer occurs over an annular contact area, having a radial dimension and a circumferential dimension.

Preferably, the radial dimension of the annular contact area is sufficient to enable conductive electrical contact to be maintained in even upon the occurrence of an offset between the axes of the lens and the FPC. In an exemplary implementation, the subject device could prevent short circuits up to an offset tolerance of 0.4 mm, and could also prevent open circuiting up to a tolerance of 6 mm.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PREFERRED EMBODIMENTS

In the following description, for purposes of explanation, specific numbers, materials and configurations are set forth in order to provide a thorough understanding of the invention. It will be apparent, however, to one having ordinary skill in the art that the invention may be practiced without these specific details. In some instances, well-known features may be omitted or simplified so as not to obscure the present invention. Furthermore, reference in the specification to phrases such as "one embodiment" or "an embodiment" means that a particular feature, structure or characteristic described in connection with the embodiment is included in at least one embodiment of the invention. The appearances of phrases such as "in one embodiment" in various places in the specification do not necessarily all refer to the same embodiment.

Figure 1:
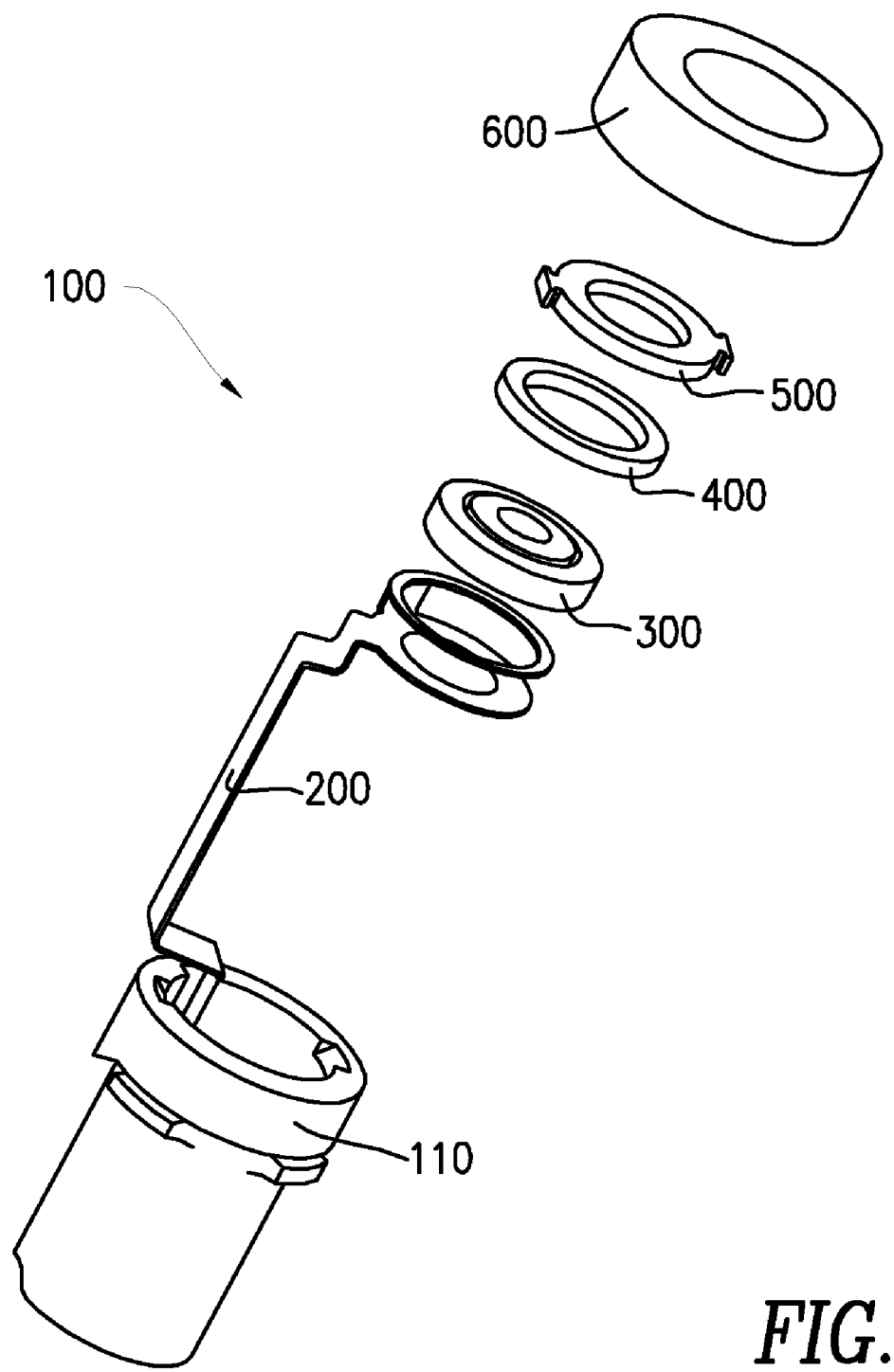
FIG. 1 is a blown up view of a lens barrel assembly.

FIG. 1 is a blown up view of a lens barrel assembly 100. Lens barrel assembly 100 may include lens barrel 110, flexible printed circuit 200, liquid lens 300, cushion 400, rotation prevention plate 500, and/or lens cap 600. Lens barrel assembly 100 form part of an optical assembly for a digital camera or other imaging apparatus. A selection of the parts listed above will be discussed in greater detail below.

In one embodiment, lens 300 may have an annular shape and have an outside diameter between 5 millimeters (mm) and 10 mm. Similarly FPC 700 (FIG. 3) may have an annular shape and may have an outside diameter between 5 mm and 10 mm. However, lens 300 and/or FPC 700 may have diameters less than 5 mm or greater than 10 mm.

Figure 2:
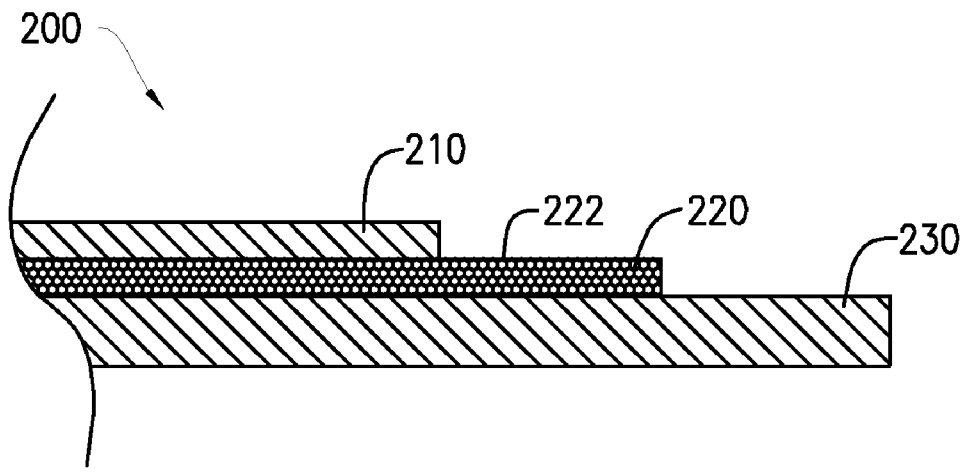
FIG. 2 is a sectional view of a portion of an existing flexible printed circuit (FPC) showing various layers thereof.

FIG. 2 is a sectional view of a portion of an existing flexible printed circuit (FPC) 200. FPC 200 may include cover 210, electrode 220, and/or base 230, where base 230 may be made of resin. The electrode 220 of FPC 200 is only partially insulated by cover 210, thereby leaving electrode surface 222 exposed to external devices. This situation may make electrode 220 susceptible to a risk of forming a short circuit with external electrical contact points.

Figure 3:
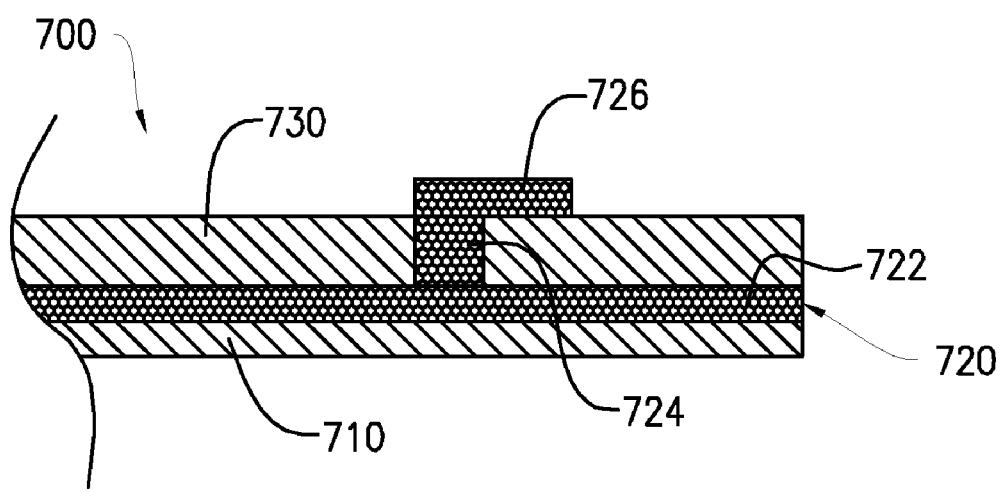
FIG. 3 is a sectional view of a portion of a flexible printed circuit in accordance with an embodiment of the present invention.

FIG. 3 is a sectional view of a portion of a flexible printed circuit 700 in accordance with an embodiment of the present invention. In one embodiment, the overall configuration of FPC 700 would be as shown in FIG. 4. Specifically, the FPC 700 may be an annular structure having a cross-sectional configuration as shown in FIG. 3. However, the present invention is not limited to this embodiment. FPC 700 need not have an annular shape, but may have any shape suitable for a particular application.

Flexible printed circuit 700 may include base 730, cover 710 and electrode 720. Base 730 and cover 710 may also be referred to generically as "insulating layers" and may be made of resin. However, the insulating layers may be made of materials other than resin. Electrode 720 may include electrode center portion 722, electrode post 724, and/or electrode contact layer (electrode contact layer) 726. Electrode 720 may be a single integral part, or alternatively may be assembled from separate parts 722, 724, and 726.

FPC 700 may be annularly shaped, and thus, may have a circumferential dimension and a radial dimension. In this case, the left-to-right dimensions shown in FIG. 3 correspond to the radial dimensions of various parts of the FPC 700 structure. However, for the sake of convenience herein, the left-to-right distances corresponding to the dimensions of parts of FPC 700 shown in FIG. 3 may also be referred to as the "lengths" of the parts of FPC 700.

The electrode 720 of FPC 700 is preferably insulated over a greater portion of its surface area than is electrode 220 of FPC 200. Moreover, electrode 720 is preferably "selectively exposed" in that electrode contact layer 726 may be produced with a defined length (the left-to-right, radial dimension in the view of FIG. 3) and may be strategically positioned along the upper surface of FPC 700 to ensure optimum electrical performance upon being placed in contact with liquid lens 300. Moreover, the geometry of electrode contact layer 726 may be customized based on the geometry of a particular lens 300 and/or on the geometry of a particular lens electrode 320 to which FPC 700 will be assembled.

For the sake of convenience the insulating layers (either cover 710 or base 730) may be referred to herein as "top layers", "upper layers", "lower layers", or "bottom layers" herein. Such terms are intended to refer to the relative arrangement of the electrode 720 and the layers 710, 730 as shown in FIG. 3, regardless of the overall orientation of lens 300 and FPC 700 in relation to a global coordinate system.

Figures 4A, 4B:
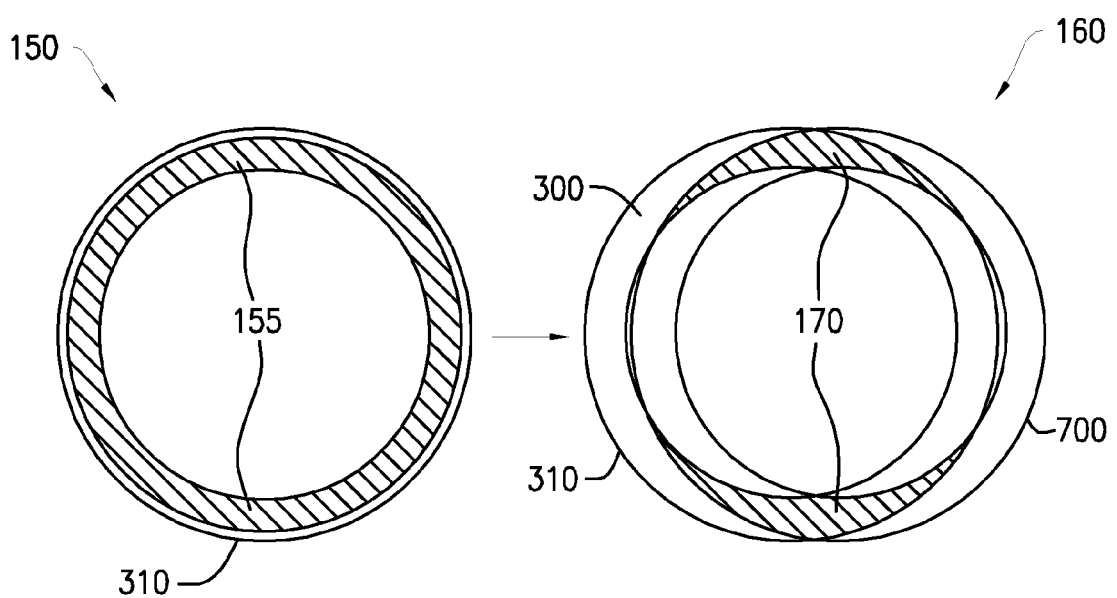
FIG. 4A is an end view of a lens disposed in contact with, and superimposed over, an FPC in accordance with an embodiment of the invention.
FIG. 4B is a view of the assembly of FIG. 4A in which the FPC has been moved to the right, in accordance with an embodiment of the invention.

FIG. 4A is an end view of an assembly 150 of a lens 300 disposed in contact with, and superimposed over (in the view of FIG. 4A), an FPC 700 in accordance with an embodiment of the invention. FIG. 4B is a view of a modified assembly 160 of FIG. 4A in which the FPC 700 has been moved to the right, in accordance with an embodiment of the invention.

In the embodiment of FIG. 4, lens 300 and FPC 700 present respective annular surfaces for conductive contact therebetween. The hatched areas in FIGS. 4A and 4B preferably correspond to areas of electrical contact between lens 300 and FPC 700. FIG. 4A shows an arrangement in which lens 300 and FPC 700 are optimally oriented and positioned with respect one another. Accordingly, the relatively large hatched area 155 in FIG. 4A is indicative of a large amount of conductive electrical contact surface area in effect between lens 300 and FPC 700.

FIG. 4B shows assembly 150 in which FPC 700 has been to the right (in the view of FIG. 4) relative to lens 300 to form modified assembly 160. Although FPC 700 and lens 300 are no longer optimally positioned with respect to one another as in FIG. 4A, the hatched areas 170 shown in FIG. 4B are indicative of regions where conductive electrical contact has been maintained. The preservation of conductive contact areas 170 in spite of the existence of an offset between the axes of the lens 300 and the FPC 700 is made possible by the annular configurations of the electrical contact surfaces on lens 300 and on FPC 700. The ability to preserve electrical contact in spite of offset positioning of parts 300 and 700 is discussed in greater detail below.

The geometries of the annularly shaped lens 300, the annularly shaped FPC 700, and the annularly shaped electrical contact area 155 formed therebetween operate to enable electrical contact to maintained, albeit with a reduced conductive surface area, if the axes of the annular lens 300 and the annular FPC 700 are offset and/or misaligned.

Figure 5:
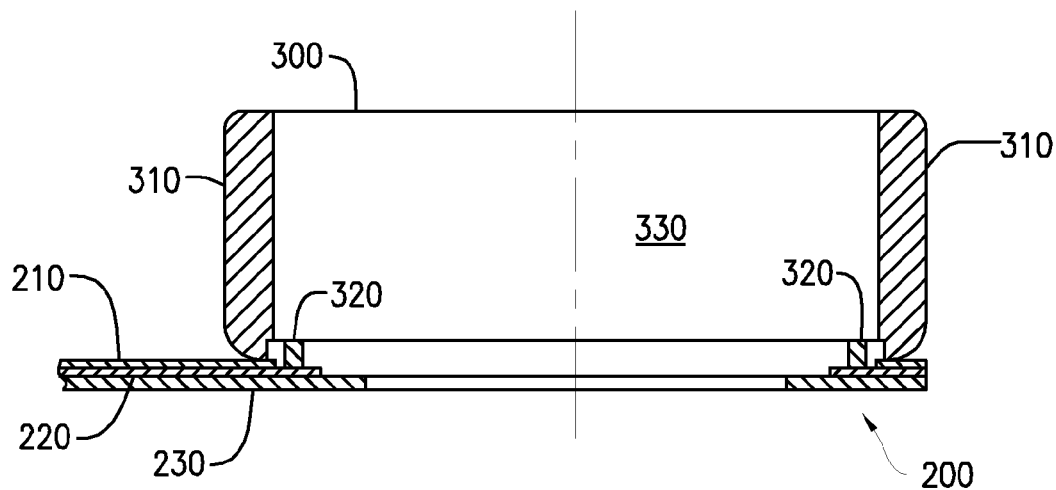
FIG. 5 is a partially elevational and partially sectional view of a lens disposed in proximity to an existing FPC.
Figure 6:
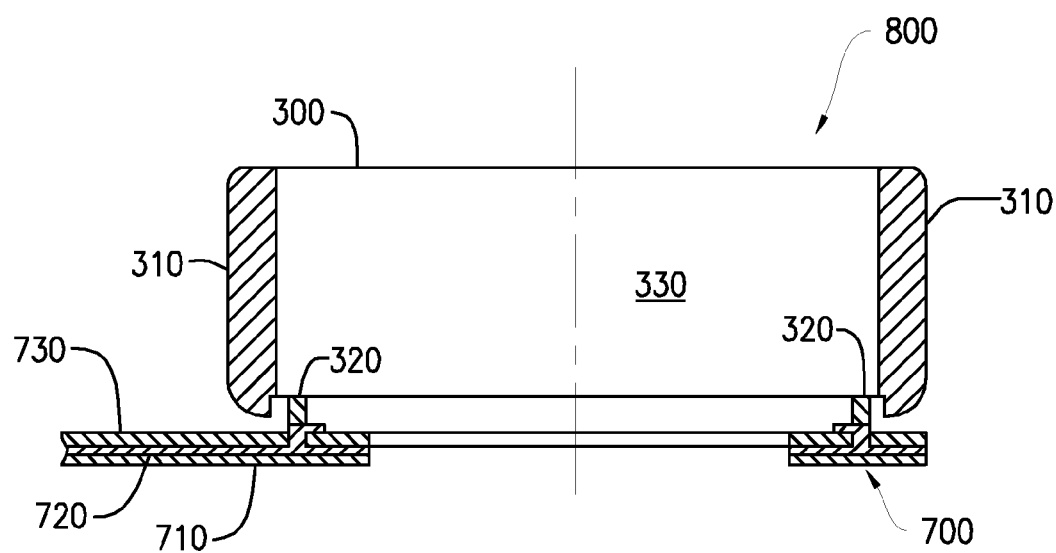
FIG. 6 is a partially elevational and partially sectional view of a lens disposed in proximity to an FPC in accordance with an embodiment of the present invention.

FIG. 5 is a partially elevational and partially sectional view of a lens 300 mounted on an existing FPC 200. Lens 300 may be a liquid lens. Lens 300 may include center portion 330, one or more first electrodes 310 and/or one or more second electrodes 320. Preferably, electrode 320 establishes conductive electrical contact with an electrode 220 of FPC 200, or with electrode 720 of FPC 700 (FIG. 6). It is preferred that electrode 310 of lens 300 not establish conductive electrical contact with the electrodes of either FPC 200 or FPC 700, since such contact would cause a short-circuit condition. FIGS. 5-11 are discussed below with the above objectives in mind.

Figure 7:
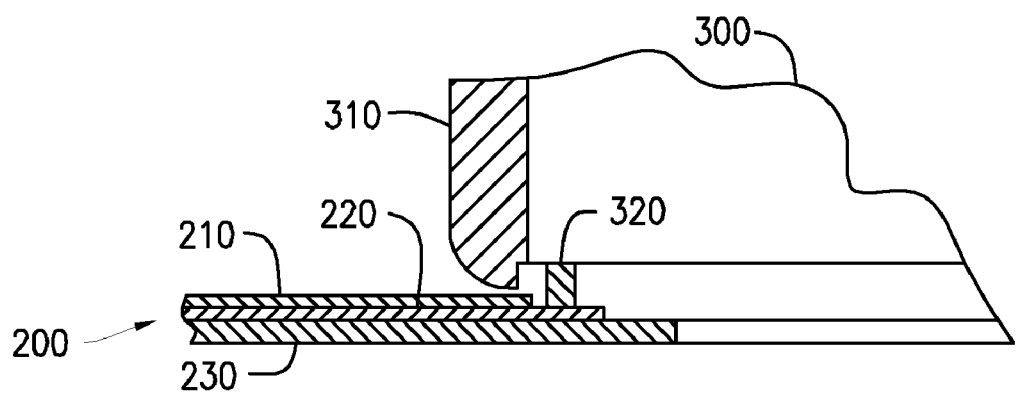
FIG. 7 shows the mounting of the lens on the FPC of FIG. 5 in greater detail.
Figure 8:
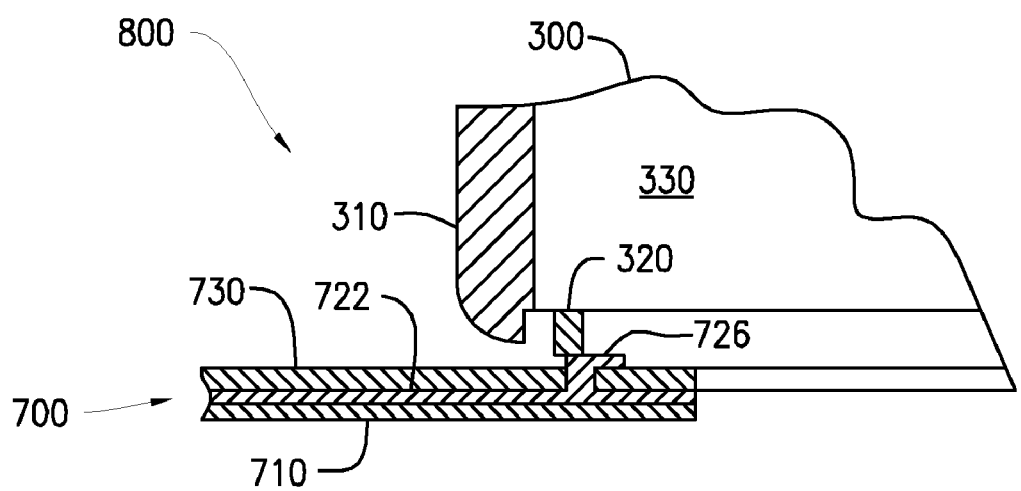
FIG. 8 shows the mounting of the lens on the FPC of FIG. 6 in greater detail.
Figure 9:
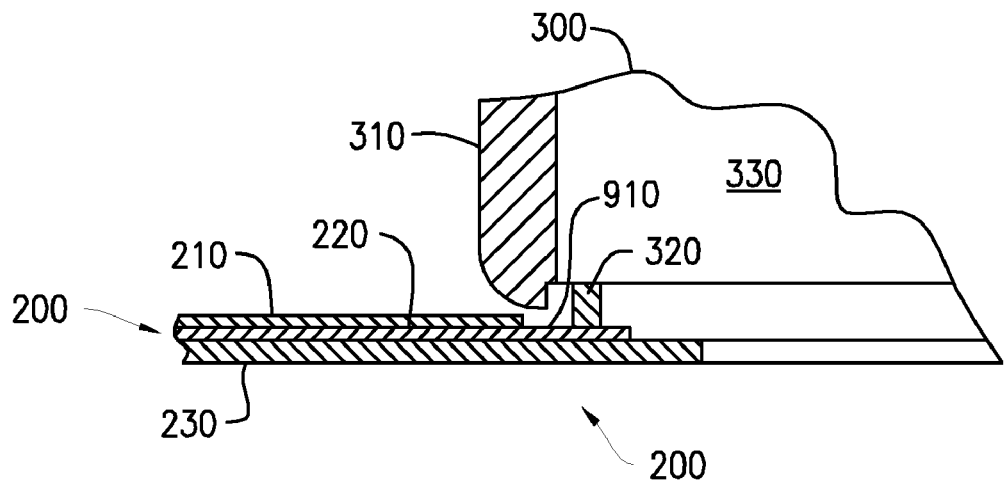
FIG. 9 shows the mounting of the lens on the FPC of FIG. 7 after the FPC is shifted toward the left.
Figure 10:
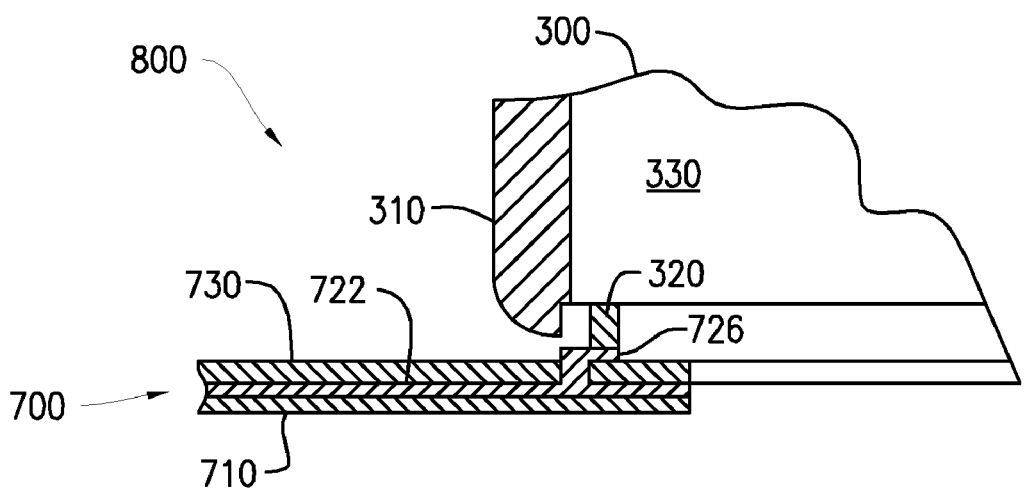
FIG. 10 shows the mounting of the lens on the FPC of FIG. 8 after the FPC is shifted toward the left.
Figure 11:
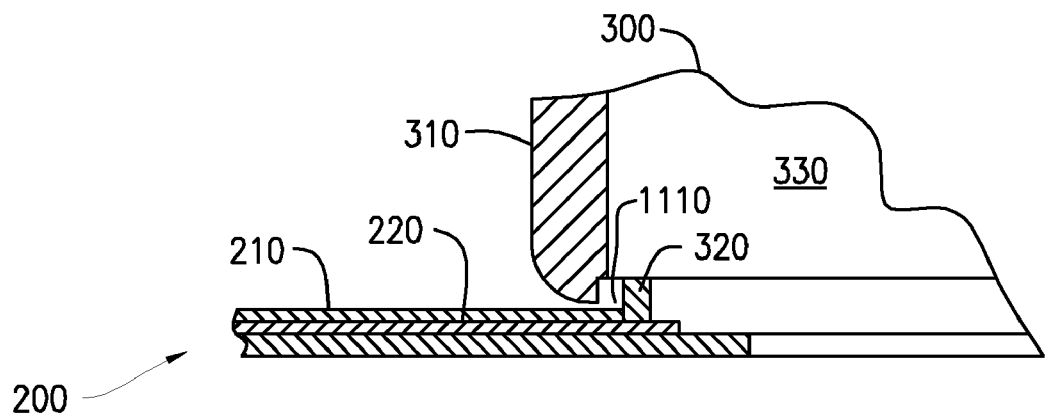
FIG. 11 shows the mounting of the lens on the FPC of FIG. 7 after the FPC is shifted toward the right.
Figure 12:
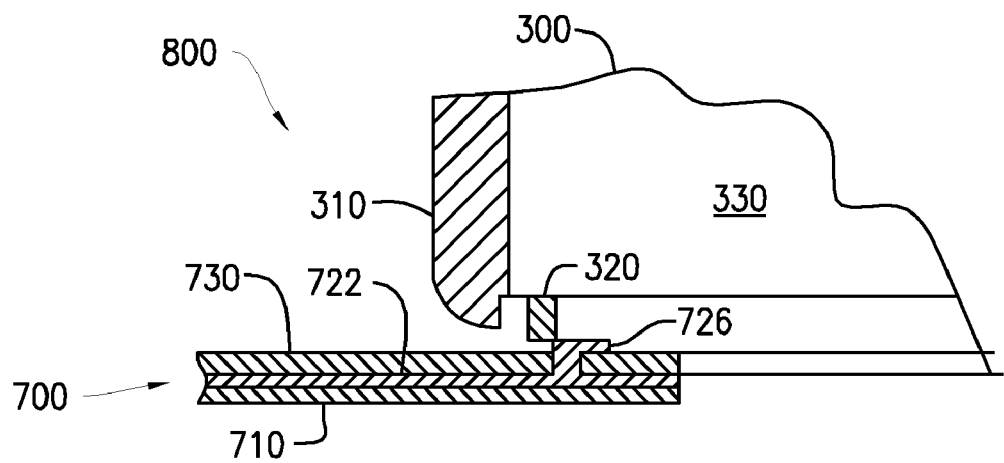
FIG. 12 shows the mounting of the lens on the FPC of FIG. 8 after the FPC is shifted toward the right.

It will be recalled, that in a preferred embodiment, FPC 200 or 700, liquid lens 300, and the interface region therebetween are annular. However, for the sake of simplicity, FIGS. 7-12 present cross-sectional views of just one portion of the various annularly shaped interface regions. More specifically, FIGS. 7, 9, and 11 are cross-sectional views of the left side of the assembly shown in FIG. 5, with various positions of FPC 200 with respect to lens 300. Likewise, FIGS. 8, 10, and 12 are cross-sectional views of the left side of the assembly shown in FIG. 6, with various positions of FPC 700 with respect to lens 300.

FIG. 6 is a partially elevational and partially sectional view of a lens 300 mounted on an FPC 700 in accordance with an embodiment of the present invention. The details of the mounting of lens 300 on FPCs 200 and 700 are explored in greater detail in connection with FIGS. 7-11, below. In this embodiment, the outer diameter of electrode contact layer 726 is preferably smaller than the outer diameter of electrode 320. This feature is best seen in FIG. 8.

In the following, the issues confronted by the assembly of lens 300 to existing FPC 200 are discussed in connection with FIGS. 7, 9, and 11.

FIG. 7 is a sectional view of a portion of the mounting of the lens 300 on FPC 200 of FIG. 5 in greater detail. FIG. 7 shows lens 300 and FPC 200 with desirable relative positioning therebetween. With the desired relative positioning shown in FIG. 7, the electrical connection between lens 300 and FPC 200 generally operates as desired. However, the arrangement shown in FIG. 7 may be susceptible to electrical connectivity problems if either FPC 200, or a portion thereof, such as cover 210, shifts either to the left or the right (in the view of FIGS. 7, 9, and 11) with respect to lens 300.

FIG. 8 however shows a system wherein there is no cover. In order for a short to occur, the electrode would have to move all the way over so electrode 310 touches cover 726. Accordingly, a much greater error would have to occur, meaning the chance of a short is much less.

FIG. 9 shows the assembly of FIG. 7 in which either FPC 200, and/or the cover 210 of FPC 200, moves leftward with respect to lens 300, in comparison with the relative positioning shown in FIG. 7. Leftward movement of cover 210 tends to bring exposed electrode area 910 into proximity with electrode 310. Electrode area 910 is generally at the same voltage level as electrode 320 of lens 300, which is generally at a different voltage level than electrode 310. Accordingly, bringing electrode 310 into proximity with exposed area 910 of electrode 220 could cause a short circuit. Such a short circuit would massively disrupt the operation of the lens barrel assembly 100. Thus, this arrangement of parts poses a significant problem. Other possible electrical connectivity problems arising from the assembly configuration of FIG. 7 are explored below in connection with FIG. 11.

FIG. 11 shows the lens 300 and FPC 200 assembly of FIG. 7 in which the FPC 200, or cover 210 of FPC 200, has been shifted toward the right (in the view of FIG. 7) in relation to lens 300. As cover 210 moves toward the right, the right edge of cover 210 ultimately impinges on electrode 320 of lens 300. An area of contact between cover 210 and electrode 320 is shown generally by reference numeral 1110. In this situation, upon moving beyond a point of initial contact, cover 210 operates to move electrode 320 upward, and thus away from its intended region of electrical contact on electrode 220 of FPC 200. This disconnection operates to undesirably electrically isolate lens 300 and FPC 200 from one another. This disruption of electrical connectivity between lens 300 and FPC 200 is highly disruptive to the operation of lens barrel assembly 100 and any device it is enclosed within, such as a digital camera. Accordingly, alternative arrangements of parts are discussed in the following.

In the following, the effect of relative motion between a lens 300 and an FPC 700 is examined in connection with an embodiment of the present invention, with reference to FIGS. 8, 10, and 12.

FIG. 8 shows the mounting of lens 300 on FPC 700 of FIG. 6 in greater detail. In the following discussion, the effect of moving FPC 700, or insulating layer 730 (which may be a base) of FPC 700, leftward or rightward relative to lens 300 is described.

As stated above, FIGS. 8, 10, 12 are detailed cross-sectional views of the left side of the embodiment of FIG. 6. Upon viewing the assembly 800 shown in FIG. 6 as a whole, the concept of leftward or rightward relative movement is readily understood. However, when viewing cross-sectional areas of only one portion of the interface between lens 300 and FPC 700, the effect on electrical connectivity in such sub-regions is best understood by denoting the movement of FPC 700 relative to lens 300 as being radially inward or radially outward.

Specifically, leftward motion of FPC 700 with respect to lens 300 causes radially outward motion of FPC 700 with respect to lens 300 on the left side of assembly 800 and causes radially inward movement of FPC 700 relative to lens 300 on the right side of assembly 800. Conversely, rightward motion of FPC 700 with respect to lens 300 causes radially inward motion of FPC 700 with respect to lens 300 on the left side of assembly 800 and causes radially outward movement of FPC 700 relative to lens 300 on the right side of assembly 800. At points on the assembly 800 other than the left and right sides, the relative movement may be neither radially inward nor radially outward, but merely lateral. This is explained further in connection with FIGS. 4A and 4B.

The left and right sides of assembly 800, discussed above, may also apply to the assemblies 150 and 160 shown in FIGS. 4A and 4B, respectively. At the top and bottom of assemblies 150 and 160, the relative movement may be primarily lateral, rather than purely radially inward or outward.

For example, in the situation shown in FIG. 4B, the left-to-right offset between the axes of FPC 700 and lens 300 is sufficiently large to eliminate electrical connectivity at the leftmost and rightmost edges of assembly 160. However, top and bottom areas form regions 170 where electrical connectivity is maintained. In this manner, this embodiment operates to preserve electrical connectivity between FPC 700 and lens 300 even in the presence of a substantial offset between the axes of lens 300 and the FPC 700.

We first examine the effect on the left side of assembly 800 of moving FPC 700 leftward (thus, radially outward) relative to lens 300. FIG. 10 shows the assembly of FIG. 8 in which FPC 700 has been moved leftward relative to lens 300. The problem of exposure of electrode 220 to electrode 310 that posed the risk of short circuit in the assembly shown in FIG. 9 is avoided in the embodiment of FIG. 10 because insulating layer 730 extends substantially completely over the upper surface of electrode center portion 722, thereby insulating electrode center portion 722 from electrode 310 and thereby operating to avoid a short circuit condition.

Referring to FIG. 10, a short circuit between lens 300 electrode 310 and electrode contact layer 726 is avoided during initial leftward movement of FPC 700 by maintaining a sufficient distance therebetween. As FPC 700 moves still further leftward, electrode 320, which preferably remains fixed with respect to lens 300, ends up being located progressively further to the right along the upper surface of electrode 720 contact layer 726. FIG. 10 shows electrode 320 at a location in which its right surface is substantially flush with the right side surface of electrode contact layer 726.

Mechanical engagement and electrical connection between electrode 320 and electrode contact layer 726 may be maintained along other regions 170 of the circumference of the annular interface between lens 300 and FPC 700, as shown in FIG. 4B. Thus, the nature of the electrical contact geometry provided in an embodiment of the present invention may operate to enable electrical connectivity between lens 300 and FPC 700 to be preserved even in the presence of an offset (i.e. a positioning error) between the two mating parts (lens 300 and FPC 700) that exceeds the magnitude of the radial dimension (the left-to-right dimension in the view of FIGS. 8, 10, and 12) of the annularly shaped electrode contact layer 726.

We next examine the effect on the left side of assembly 800 (FIG. 6) of moving FPC 700 rightward (that is, radially inward) relative to lens 300 in the assembly of FIG. 8. FIG. 12 shows the assembly of FIG. 8 in which FPC 700 has been shifted to the right in relation to lens 300. As FPC 700 moves rightward, electrode 320 preferably remains fixed with respect to lens 300. Thus, with rightward movement of FPC 700, electrode contact layer 726 moves rightward with respect to electrode 320, while maintaining electrical connectivity therewith. It may be seen that, at the stage of advancement shown in FIG. 12, electrode contact layer 726 has moved significantly with respect to its starting position as shown in FIG. 8. Yet, the structural integrity of the assembly of lens 300 and FPC 700, and conductive electrical contact between electrode contact layer 726 and electrode 320 are preferably maintained throughout the travel of FPC 700 with respect to lens 300.

If the portions of FPC 700 and lens 300 shown in FIG. 12 were to completely lose contact (see FIG. 4), secure mechanical engagement and electrical connectivity between lens 300 and FPC 700 could still be maintained by regions 170 elsewhere along the circumference of the annular interface between these two parts, as shown in FIG. 4B.

The problem of electrical isolation of lens 300 from FPC electrode 720, that was incurred in the assembly of FIG. 11, is avoided because there is no insulating layer, such as cover 210, of FIG. 11, that is located closer to lens 300 than is the electrode contact layer 726. Thus, there is no layer that, when advanced toward electrode 320 due to misplacement of parts 300 and 700, impinges on electrode 320 and thereby disrupts its contact with FPC 700.

Thus, in this embodiment, the fact that electrode contact layer 726 is located closer to electrode 320 (along the vertical dimension in the view of FIG. 12) than insulating layer 730 beneficially avoids the electrical isolation problem noted in the assembly of FIG. 11.

Thus, an embodiment of the geometry of electrode 720 may enable lens 300 and FPC 700 to move laterally with respect to one another over the annular interface therebetween without either a) causing a short circuit between electrode 310 and electrode 720 or b) causing electrode 320 to become electrically isolated from electrode 720.

The ability to preserve electrical connectivity between electrode 320 and electrode contact layer 726 at a given point along the circumferences thereof may be a function of the radial dimension of electrode 320 and/or the radial dimension of electrode contact layer 726. In an embodiment, it is desirable to maintain electrical connectivity between electrode 320 and electrode contact layer 726 along the entire circumference of the annular interface region between these two parts, even in the presence of an offset in the axes of lens 300 and FPC 700. However, as discussed above, and illustrated in FIG. 4B, in an embodiment of the invention disclosed herein, electrical connectivity between electrode 320 and electrode 720 of FPC 700 may be maintained even if contact is lost along one or more segments of the circumference of the annular interface between electrode 310 and FPC electrode 720.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A printed circuit comprising:
    a first insulating layer;
    a second insulating layer;
    and an electrode including:
        an electrode center portion disposed between the first and second insulating layers;
        an electrode post portion in contact with the electrode center portion and extending through at least a portion of the first insulating layer; and
        an electrode contact layer of substantially uniform height on the first insulating layer and connected to the electrode post, the electrode contact layer being substantially annular in shape and being dimensioned and shaped to establish electrical contact with a substantially annular contact layer on a device to be connected with the printed circuit.

2. The printed circuit of claim 1 wherein the first insulating layer, second insulating layer, and electrode center portion have substantially the same length.

3. The printed circuit of claim 1 wherein the electrode center portion is insulated along an entirety of its length, along its lower surface, by the second insulating layer.

4. The printed circuit of claim 1 wherein the electrode center portion is insulated over an upper surface thereof, along substantially an entirety of its length.

5. The printed circuit of claim 1 wherein the electrode contact layer is disposed above the first insulating layer.

6. The printed circuit of claim 1 wherein the electrode contact layer is disposed along an exterior of the printed circuit.

7. The printed circuit of claim 1 wherein the electrode contact layer has a length configured to accommodate movement of the printed circuit with respect to an external part in conductive contact with the electrode contact layer, while maintaining the conductive contact.

8. The printed circuit of claim 1 wherein the length of the electrode contact layer is substantially less than the length of the electrode center portion.

9. The printed circuit of claim 1 wherein the device is an electrically powered lens.

10. An optical assembly, comprising:
    a lens having first and second electrodes; and
    a flexible printed circuit (FPC) configured for placement in proximity to the lens, wherein the FPC comprises:
        a bottom insulating layer;
        a top insulating layer;
        and an FPC electrode configured to contact the second electrode of the lens,
        wherein the FPC electrode comprises:

a center portion disposed between the bottom and top insulating layers of the FPC;

a post connected to the center portion and extending through the top insulating layer of the FPC; and a contact layer of substantially uniform height on the top insulating layer and connected to the post, the contact layer being dimensioned and shaped to provide contact with the second electrode of the lens;

the second lens electrode and the FPC electrode contact layer being substantially annular and constructed to be in a superposed relationship when in contact.

11. The assembly of claim 10 wherein the FPC electrode contact layer is disposed between the top insulating layer and the lens.

12. The assembly of claim 10 wherein the FPC electrode contact layer is configured to maintain conductive electrical contact with the second lens electrode upon the occurrence of lateral movement between the lens and the FPC.

13. The assembly of claim 10 wherein the second lens electrode and the FPC electrode layer are constructed so that them occurs over an annular contact area, having a radial dimension and a circumferential dimension.

14. The assembly of claim 13 wherein the radial dimension of the annular contact area is sufficient to enable conductive electrical contact to be maintained even upon the occurrence of an offset between the axes of the lens and the FPC.

15. The assembly of claim 14 wherein the conductive electrical contact is maintained if the offset is less than or equal to 1 millimeter (mm).

16. The assembly of claim 14 wherein the conductive electrical contact is maintained if the offset is less than or equal to 5 millimeters.

17. The assembly of claim 14 wherein the conductive electrical contact is maintained if the offset is less than or equal to 10 millimeters.

* * * * *